US011889625B2

(12) United States Patent
Katsube

(10) Patent No.: US 11,889,625 B2
(45) Date of Patent: Jan. 30, 2024

(54) MODULE AND METHOD OF MANUFACTURING THE SAME

(71) Applicant: Murata Manufacturing Co., Ltd., Kyoto-fu (JP)

(72) Inventor: Akio Katsube, Kyoto-fu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/644,446

(22) Filed: Dec. 15, 2021

(65) Prior Publication Data

US 2022/0110211 A1    Apr. 7, 2022

Related U.S. Application Data

(63) Continuation of application No. PCT/JP2020/024805, filed on Jun. 24, 2020.

(30) Foreign Application Priority Data

Jun. 27, 2019    (JP) ................. 2019-120089

(51) Int. Cl.
*H05K 1/14*    (2006.01)
*H01L 23/12*    (2006.01)
*H05K 1/02*    (2006.01)

(52) U.S. Cl.
CPC ............. *H05K 1/141* (2013.01); *H01L 23/12* (2013.01); *H05K 1/0224* (2013.01)

(58) Field of Classification Search
CPC .... H05K 1/14; H05K 1/141–147; H05K 1/18; H05K 1/181–187; H05K 1/0213;
(Continued)

(56) References Cited

U.S. PATENT DOCUMENTS 8,093,691 B1    1/2012  Fuentes et al.
9,456,488 B2 *  9/2016  Shimamura .......... H05K 9/0083
(Continued)

FOREIGN PATENT DOCUMENTS

JP    2016-072411 A    5/2016
WO    2007/049458 A1    5/2007
(Continued)

OTHER PUBLICATIONS

International Search Report for International Patent Application No. PCT/JP2020/024805 dated Sep. 24, 2020.
(Continued)

*Primary Examiner* — Tuan T Dinh
(74) *Attorney, Agent, or Firm* — Pearne & Gordon LLP

(57) ABSTRACT

A module includes: a wiring board as a ceramic board having a first main surface; a first component and a second component that are mounted on the first main surface; at least one conductive member disposed on the first main surface between the first component and the second component; a sealing resin that seals the first component, the second component, and the conductive member; and a shield film that covers an upper surface and a side surface of the sealing resin and a side surface of the wiring board. The shield film is electrically connected to a ground conductor. The conductive member is formed by firing simultaneously with the wiring board, and electrically connected to the ground conductor and electrically connected to the shield film.

22 Claims, 13 Drawing Sheets

(58) Field of Classification Search
CPC ... H01L 23/552; H01L 23/12; H01L 23/3121; H01L 23/284; H01L 23/49811; H01L 23/49822; H01L 23/28; H01L 23/66; H01L 23/315
USPC ....... 361/760, 764–767, 784, 795, 816, 818; 257/660, 690, 723–730, 787–790; 174/261, 350, 520
See application file for complete search history.

(56) References Cited

U.S. PATENT DOCUMENTS

| | | | |
|---|---|---|---|
| 2006/0258050 A1* | 11/2006 | Fujiwara | H01L 23/29 257/E23.117 |
| 2006/0274517 A1* | 12/2006 | Coffy | H01L 23/552 174/262 |
| 2007/0278670 A1 | 12/2007 | Kimura et al. | |
| 2010/0013094 A1* | 1/2010 | Jo | H01L 24/13 257/773 |
| 2012/0320559 A1* | 12/2012 | Kimura | H01L 23/552 361/818 |
| 2016/0095267 A1 | 3/2016 | Kitazaki et al. | |
| 2017/0186699 A1* | 6/2017 | Li | H01L 23/552 |
| 2017/0243833 A1* | 8/2017 | Choi | H01L 21/565 |
| 2018/0092257 A1 | 3/2018 | Otsubo et al. | |
| 2018/0277489 A1* | 9/2018 | Han | H01L 24/82 |
| 2019/0274237 A1 | 9/2019 | Otsubo | |
| 2019/0289758 A1 | 9/2019 | Furuya | |
| 2020/0137893 A1 | 4/2020 | Nomura et al. | |
| 2022/0053631 A1* | 2/2022 | Kang | H01L 23/552 |

FOREIGN PATENT DOCUMENTS

| | | |
|---|---|---|
| WO | 2016/181954 A1 | 11/2016 |
| WO | 2018/101381 A1 | 6/2018 |
| WO | 2018/110397 A1 | 6/2018 |
| WO | 2019/004332 A1 | 1/2019 |

OTHER PUBLICATIONS

Written Opinion for International Patent Application No. PCT/JP2020/024805 dated Sep. 24, 2020.

* cited by examiner

MODULE AND METHOD OF MANUFACTURING THE SAME

CROSS REFERENCE TO RELATED APPLICATIONS

This is a continuation of International Application No. PCT/JP2020/024805 filed on Jun. 24, 2020 which claims priority from Japanese Patent Application No. 2019-120089 filed on Jun. 27, 2019. The contents of these applications are incorporated herein by reference in their entireties.

BACKGROUND OF THE DISCLOSURE

Field of the Disclosure

The present disclosure relates to a module and a method of manufacturing the module.

Description of the Related Art

WO 2019/004332 (PTL 1) discloses a high-frequency module. In this high-frequency module, damage to a wiring board can be reduced while the characteristics of shielding between components are maintained. In PTL 1, a Cu block called a shield component is connected to an electrode mounted on a surface of the wiring board. This Cu block is covered with a sealing resin. Note that the sealing resin is provided with an opening through which a part of an upper surface of the Cu block is exposed. The Cu block and a shield film that covers the opening in the upper surface of the Cu block constitute shielding between components.
PTL 1: WO 2019/004332

BRIEF SUMMARY OF THE DISCLOSURE

In the high-frequency module disclosed in PTL 1, the Cu block is soldered to the mounted electrode. When this high-frequency module is further mounted on another board, the high-frequency module is reflow-soldered. In this case, however, the solder connecting the Cu block and the mounted electrode is melted. The melted solder may flow between the side surface of the Cu block and the sealing resin and rise upward to the upper surface of the Cu block, and then, may jet out through the opening through which a part of the upper surface of the Cu block is exposed. Such jetting-out of solder through the opening may generate solder balls.

Thus, it is an object of the present disclosure to provide a module and a method of manufacturing the module, which allow shielding between components inside the module while still preventing problems such as jetting-out of solder and generation of undesirable solder balls even when the entire module undergoes reflowing.

In order to achieve the above-described object, a module according to the present disclosure includes: a wiring board having a first main surface, the wiring board being a ceramic board including a ground conductor; a first component and a second component that are mounted on the first main surface; at least one conductive member disposed on the first main surface between the first component and the second component; a sealing resin that seals the first component, the second component, and the conductive member; and a shield film that covers an upper surface and a side surface of the sealing resin and a side surface of the wiring board. The shield film is electrically connected to the ground conductor, and the conductive member is formed by firing simultaneously with the wiring board, and is electrically connected to the ground conductor and electrically connected to the shield film.

According to the present disclosure, since no soldered portion exists around the conductive member, a module can be configured to allow shielding between components inside the module while still preventing problems such as jetting-out of solder and generation of undesirable solder balls even when the entire module undergoes reflowing.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept "upper" or "lower" does not necessarily indicate an absolute upper or lower position, but may indicate a relatively upper or lower position in the posture shown in each figure.

First Embodiment

A module according to the first embodiment of the present disclosure will be described with reference to FIGS. 1 to 5.

Figure 1:
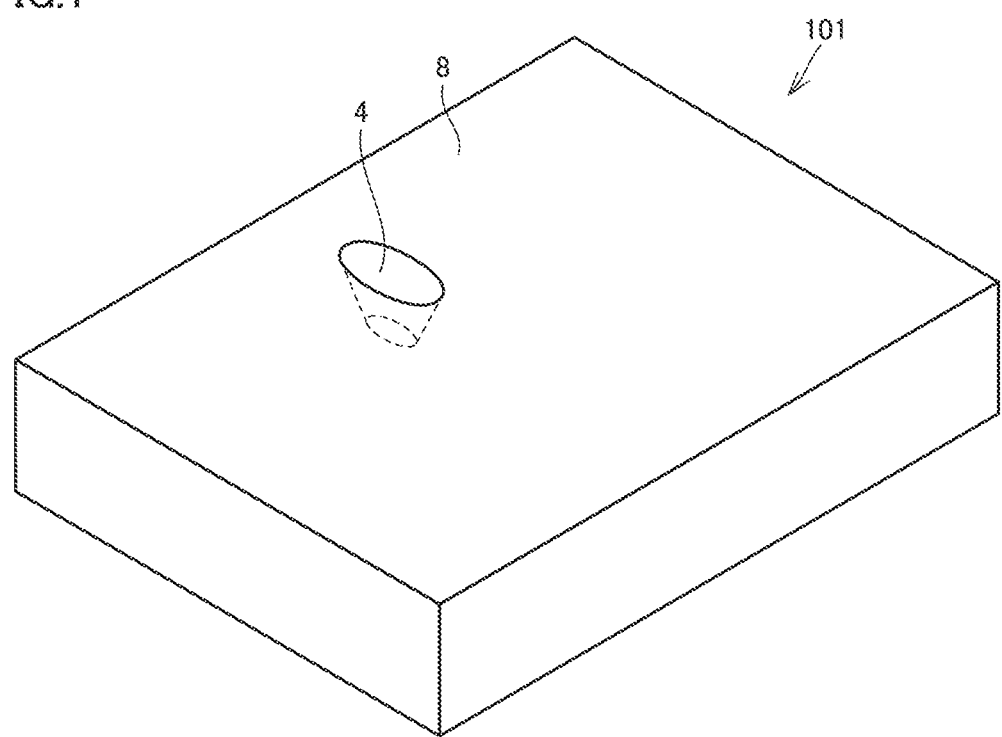
FIG. 1 is a perspective view of a module according to a first embodiment of the present disclosure.
Figure 2:
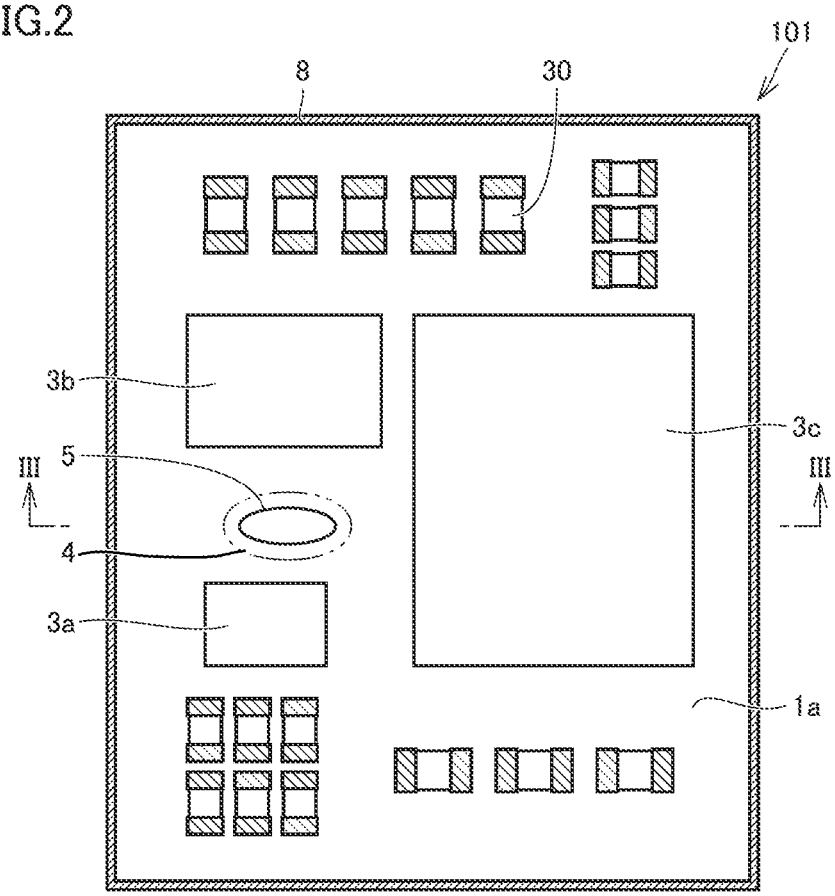
FIG. 2 is a perspective plan view of the module according to the first embodiment of the present disclosure.
Figure 3:
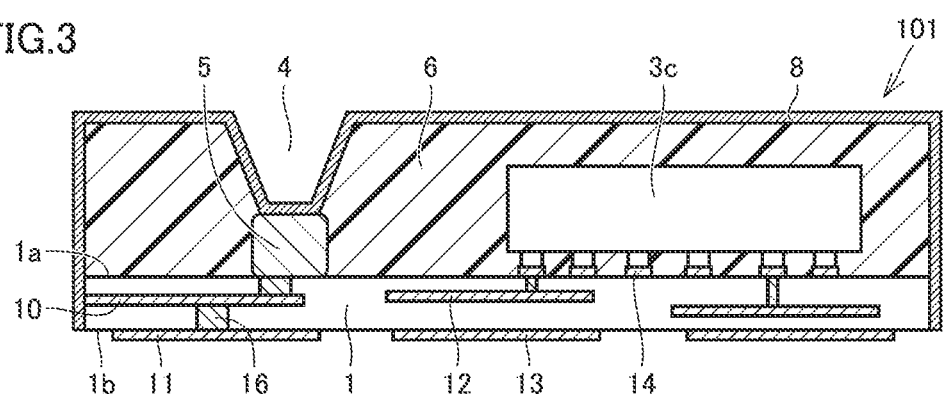
FIG. 3 is a cross-sectional view along a line III-III in FIG. 2.

FIG. 1 shows an external appearance of a module 101 according to the present embodiment. Module 101 has a rectangular parallelepiped shape, and has an upper surface and a side surface covered with a shield film 8. The upper surface of module 101 is provided with an opening 4. FIG. 2 is a perspective plan view showing the inside of module 101. FIG. 3 shows a cross-sectional view along a line III-III in FIG. 2. FIG. 2 shows the state in which shield film 8 covering the upper surface and a sealing resin 6 are removed.

Module 101 includes a wiring board 1. Wiring board 1 has a first main surface 1a and a second main surface 1b provided as a top surface and a bottom surface, respectively. Wiring board 1 is a ceramic board including a ground conductor 10. Module 101 includes a first component 3a and a second component 3b that are mounted on first main surface 1a. Further, module 101 includes at least one conductive member 5 disposed on first main surface 1a between first component 3a and second component 3b. Conductive member 5 is also referred to as a "protruding electrode". Further, module 101 includes: sealing resin 6 that seals first component 3a, second component 3b, and conductive member 5; and shield film 8 that covers the upper surface and the side surface of sealing resin 6 and the side surface of wiring board 1. Shield film 8 is electrically connected to ground conductor 10. Conductive member 5 is formed as a result of firing simultaneously with wiring board 1. In other words, conductive member 5 is disposed on wiring board 1 with no solder interposed therebetween. Further, conductive member 5 is electrically connected to ground conductor 10 and also electrically connected to shield film 8.

As shown in FIG. 2, in addition to first component 3a and second component 3b, a third component 3c may be mounted on first main surface 1a of wiring board 1. Further, a component 30 may be additionally mounted. As shown in FIG. 3, a surface electrode 14 is disposed on first main surface 1a of wiring board 1. Third component 3c is connected to surface electrode 14. Backside electrodes 11 and 13 are disposed on second main surface 1b of wiring board 1. An internal electrode 12 and an interlayer connection conductor 16 are disposed inside wiring board 1. Backside electrode 11 is electrically connected to ground conductor 10 with interlayer connection conductor 16 interposed therebetween. Ground conductor 10 and interlayer connection conductor 16 may be fired simultaneously with internal electrode 12.

At least a part of the upper surface of conductive member 5 is exposed through opening 4 provided in sealing resin 6. Note that shield film 8 covers the inner surface of opening 4 and also covers the exposed portion of the upper surface of conductive member 5. Opening 4 may be provided, for example, by laser processing applied to sealing resin 6.

Figure 4:
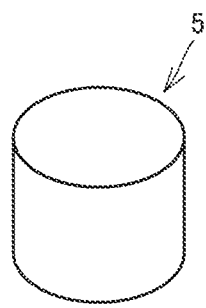
FIG. 4 is a perspective view of a first modification of a conductive member provided in the module according to the first embodiment of the present disclosure.
Figure 5:
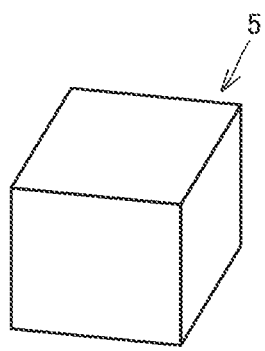
FIG. 5 is a perspective view of a second modification of the conductive member provided in the module according to the first embodiment of the present disclosure.

In the example shown in this case, conductive member 5 is a column elliptical in cross section. Specifically, conductive member 5 has an elliptical shape when viewed from directly above as shown in FIG. 2. Note that the shape of conductive member 5 is not limited to this but may be, for example, a columnar shape as shown in FIG. 4 or a cubic shape as shown in FIG. 5. Conductive member 5 may have a rectangular parallelepiped shape or a prism shape.

In the example shown in FIG. 3, interlayer connection conductor 16 is disposed to be connected to the lower surface of conductive member 5. Conductive member 5 is electrically connected via interlayer connection conductor 16 to ground conductor 10 located below conductive member 5.

First component 3a is to serve as a source from which an electromagnetic wave is emitted, and second component 3b is to avoid being interfered by an electromagnetic wave from outside.

In the present embodiment, in a region between first component 3a and second component 3b, conductive member 5 and shield film 8 that covers the inner surface of opening 4 located above conductive member 5 form a series of conductors from first main surface 1a to the upper surface of sealing resin 6, so that shielding between first component 3a and second component 3b can be implemented. In other words, shielding between components can be implemented inside module 101. Further, in the present embodiment, no soldered portion exists around conductive member 5, which prevents problems such as jetting-out of solder and generation of undesirable solder balls even when the entire module undergoes reflowing.

Since soldering is not required in forming conductive member 5, soldering failure does not occur. Further, appropriately increasing the height of conductive member 5 can reduce the depth of shaving by laser processing for providing opening 4. In order to reduce the cost related to laser processing, the height of conductive member 5 may be increased.

A method of manufacturing module 101 in the present embodiment will be described later as the sixth embodiment.

Figure 6:
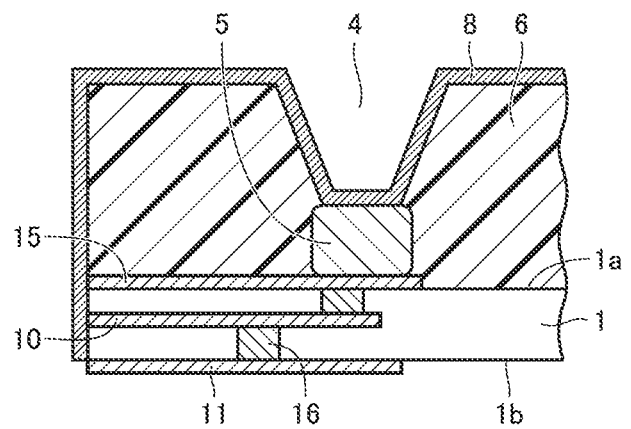
FIG. 6 is a partial cross-sectional view of a modification of the module according to the first embodiment of the present disclosure.

FIG. 6 shows a modification of module 101 in the present embodiment. As shown in FIG. 6, a surface electrode 15 may be disposed along first main surface 1a so as to electrically connect the lower surface of conductive member 5 and shield film 8 via first main surface 1a. In the example shown in FIG. 6, the lower surface of conductive member 5 and ground conductor 10 are electrically connected with interlayer connection conductor 16 interposed therebetween, and also, conductive member 5 and shield film 8 are electrically connected by surface electrode 15 disposed on first main surface 1a. In other words, electrical connection is established by two routes. However, the electrical connection may be established by only one of the two routes. In other words, interlayer connection conductor 16 connected to the lower surface of conductive member 5 may not be provided. More specifically, conductive member 5 and shield film 8 may be electrically connected only by surface electrode 15. As described above, conductive member 5 may be electrically connected to shield film 8 along the side surface of sealing resin 6.

As described in the present embodiment, it is preferable that sealing resin 6 has opening 4 above conductive member 5, and also that shield film 8 electrically connects to the upper surface of conductive member 5 in the state where shield film 8 extends to cover the inner surface of opening 4. Adopting such a configuration can ensure the electrical connection between the upper surface of conductive member 5 and shield film 8, to thereby enhance the reliability of shielding between the components.

It is preferable that wiring board 1 includes a connection electrode connecting to conductive member 5, and the connection electrode and the conductive member are made of the same material. In the example shown in FIG. 3, interlayer connection conductor 16 located directly below conductive member 5 corresponds to the connection electrode. In the example shown in FIG. 6, surface electrode 15 and interlayer connection conductor 16 that is located directly below conductive member 5 correspond to the connection electrodes.

The material of conductive member 5 is preferably Cu or Ag. Adopting such a configuration can reduce the electrical resistance in conductive member 5. Further, since Cu or Ag can be prepared as a metal paste, conductive member 5 can be fired readily simultaneously with another electrode disposed inside wiring board 1 or disposed on the surface of wiring board 1.

It is preferable that at least one of first component 3a and second component 3b has a circuit surface, and the upper end of conductive member 5 is located higher than the highest one of the circuit surfaces of first component 3a and second component 3b when viewed from first main surface 1a. The circuit surfaces of first component 3a and second component 3b are generally formed near the lower surfaces of their respective main bodies. FIG. 3 does not show first component 3a and second component 3b but shows third component 3c. Also in third component 3c, a circuit surface is formed near the lower surface of its main body. In FIG. 3, the upper surface of conductive member 5 is located sufficiently higher than the lower surface of the main body of third component 3c. The same is true for the lower surface of the main body of each of first component 3a and second component 3b. In the example shown in this case, the circuit surfaces of first component 3a and second component 3b are substantially flush with the circuit surface of third component 3c.

Since the circuit surface of each component is formed at a position lower than the upper end of conductive member 5, the circuit surfaces of the respective components are separated by conductive member 5, to thereby allow sufficient shielding between the circuit surfaces.

Second Embodiment

A module according to the second embodiment of the present disclosure will be hereinafter described with reference to FIG. 7.

Figure 7:
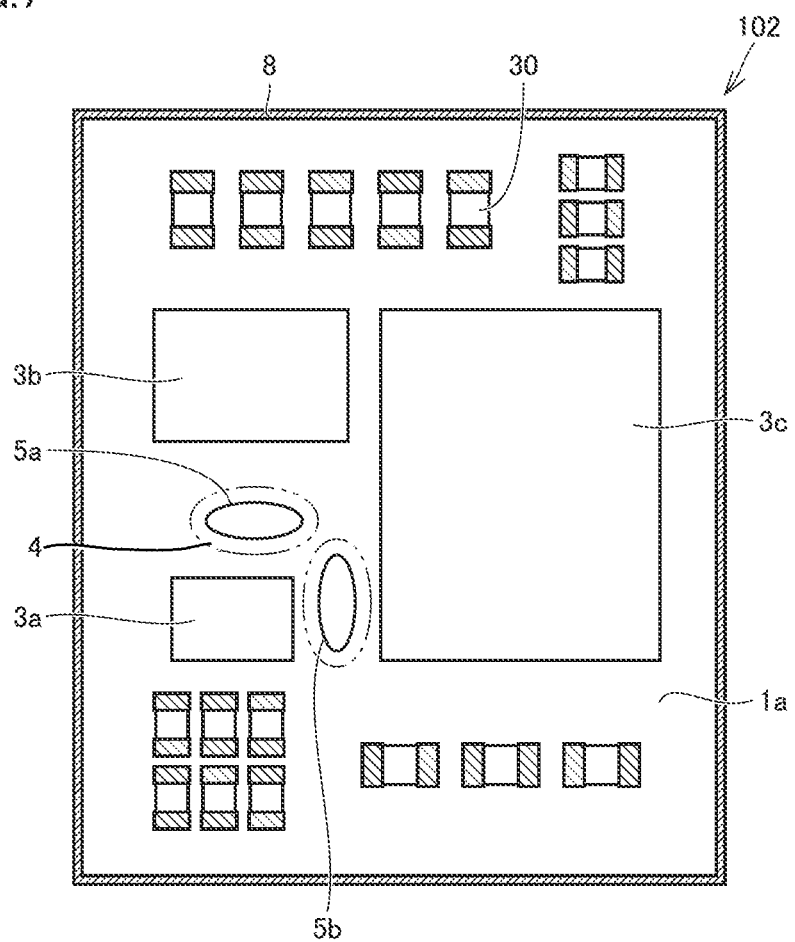
FIG. 7 is a perspective plan view of a module according to a second embodiment of the present disclosure.

FIG. 7 is a perspective plan view showing the inside of a module 102 according to the present embodiment. Module 102 includes conductive members 5a and 5b. Conductive members 5a and 5b are disposed at an angle of 90° with respect to each other. In other words, conductive members 5a and 5b are disposed to form an L shape.

First component 3a is to serve as a source from which an electromagnetic wave is emitted, and second component 3b and third component 3c are to avoid being interfered by an electromagnetic wave from outside.

Also in the present embodiment, the effect described in the first embodiment can be achieved. Further, in the present embodiment, a plurality of conductive members are disposed in the same manner as conductive members 5a and 5b, so that shielding in a plurality of different directions as viewed from first component 3a can be simultaneously implemented. In the example described in this case, shielding in two directions is implemented, but shielding in three or more directions may also be implemented.

Third Embodiment

A module according to the third embodiment of the present disclosure will be hereinafter described with reference to FIGS. 8 and 9.

Figure 8:
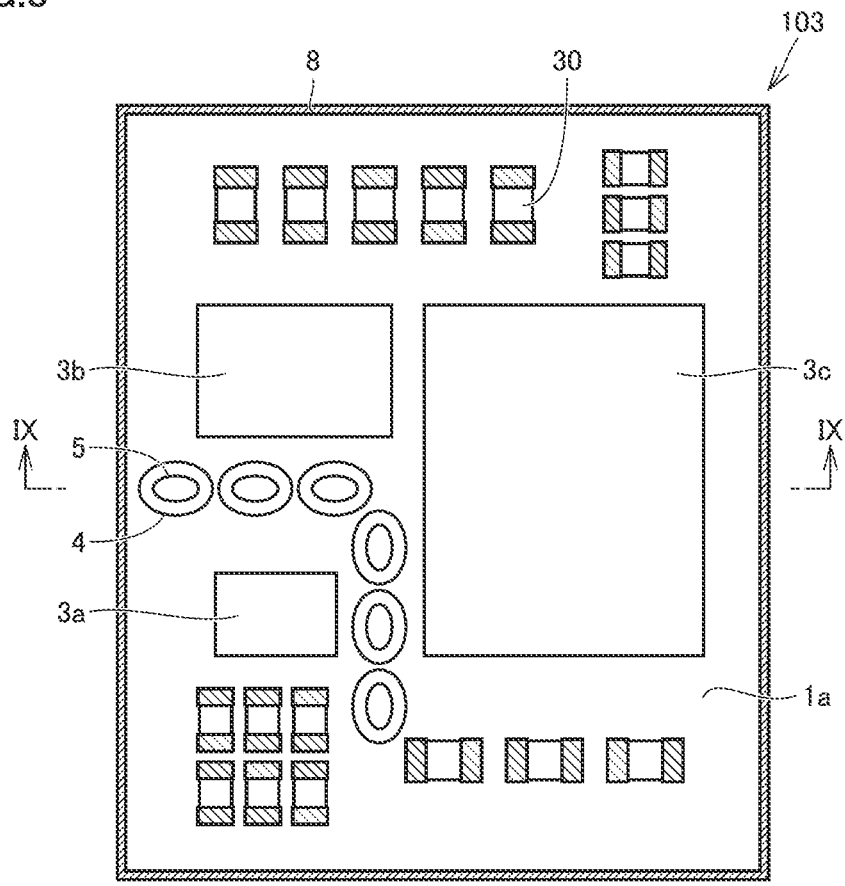
FIG. 8 is a perspective plan view of a module according to a third embodiment of the present disclosure.
Figure 9:
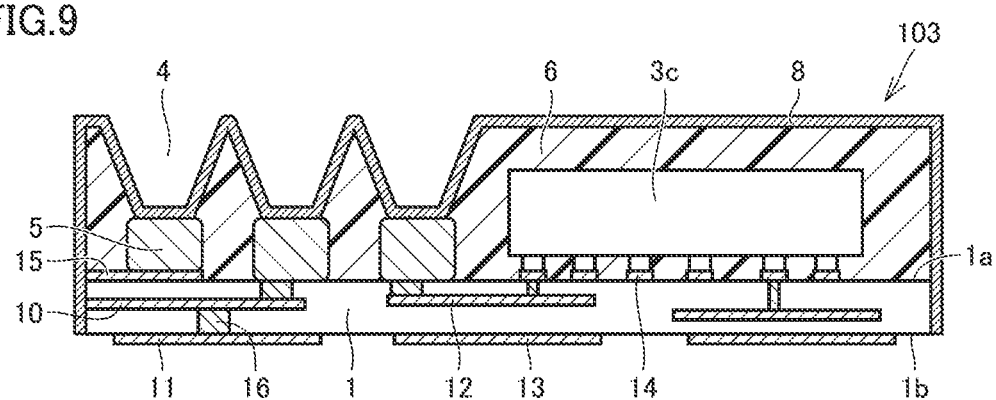
FIG. 9 is a cross-sectional view along a line IX-IX in FIG. 8.

FIG. 8 is a perspective plan view showing the inside of a module 103 in the present embodiment. In module 103, the number of conductive members 5 is larger than that in module 102. FIG. 9 is a cross-sectional view along a line IX-IX in FIG. 8. In module 103, a plurality of conductive members 5 are disposed only between first component 3a and second component 3b. A plurality of conductive members 5 are disposed also between first component 3a and third component 3c. One individual opening 4 is provided in each of conductive members 5.

Also in the present embodiment, the effect described in the second embodiment can be achieved. Particularly in a configuration in which the plurality of conductive members 5 are disposed in a row, shielding between components can be more reliably implemented.

(First Modification)

Figure 11:
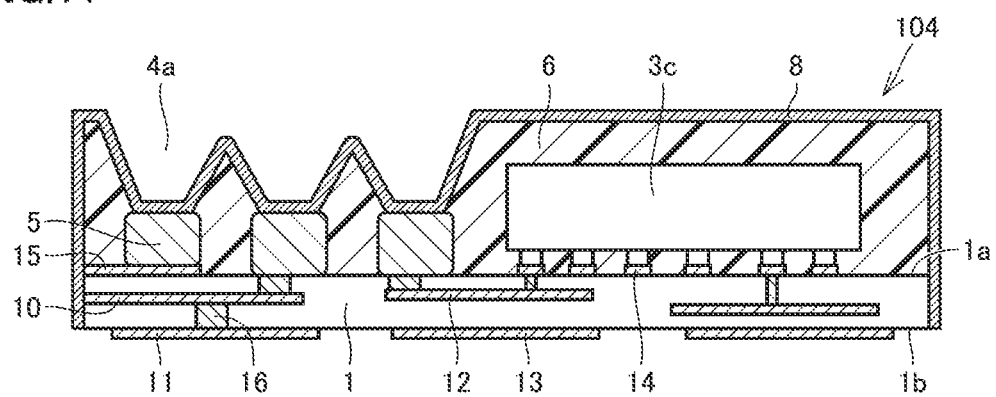
FIG. 11 is a cross-sectional view along a line XI-XI in FIG. 10.
Figure 12:
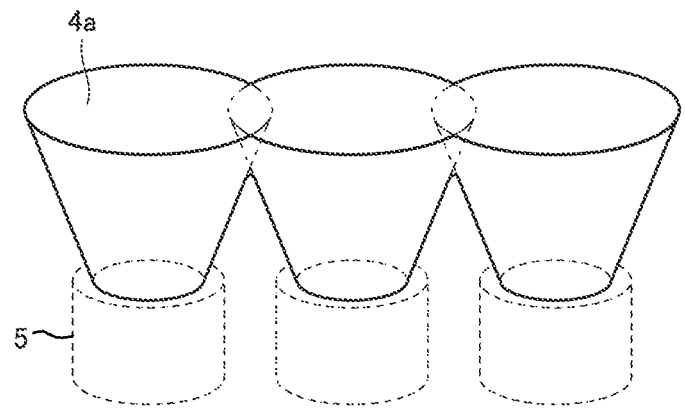
FIG. 12 is a perspective view of an opening and a plurality of conductive members provided in the first modification of the module according to the third embodiment of the present disclosure.

The first modification of the module in the present embodiment will be hereinafter described. In module 103 shown in FIGS. 8 and 9, openings 4 connected to the respective conductive members 5 are separately formed, but the openings of respective conductive members 5 adjacent to each other may be connected to and integrated with each other as in a module 104 shown in FIG. 10. FIG. 11 shows a cross-sectional view along a line XI-XI in FIG. 10. The openings corresponding to the respective conductive members 5 are connected to thereby form one large opening 4a. FIG. 12 is a perspective view showing the shapes of one opening 4a and the plurality of conductive members 5 in this case.

Figure 10:
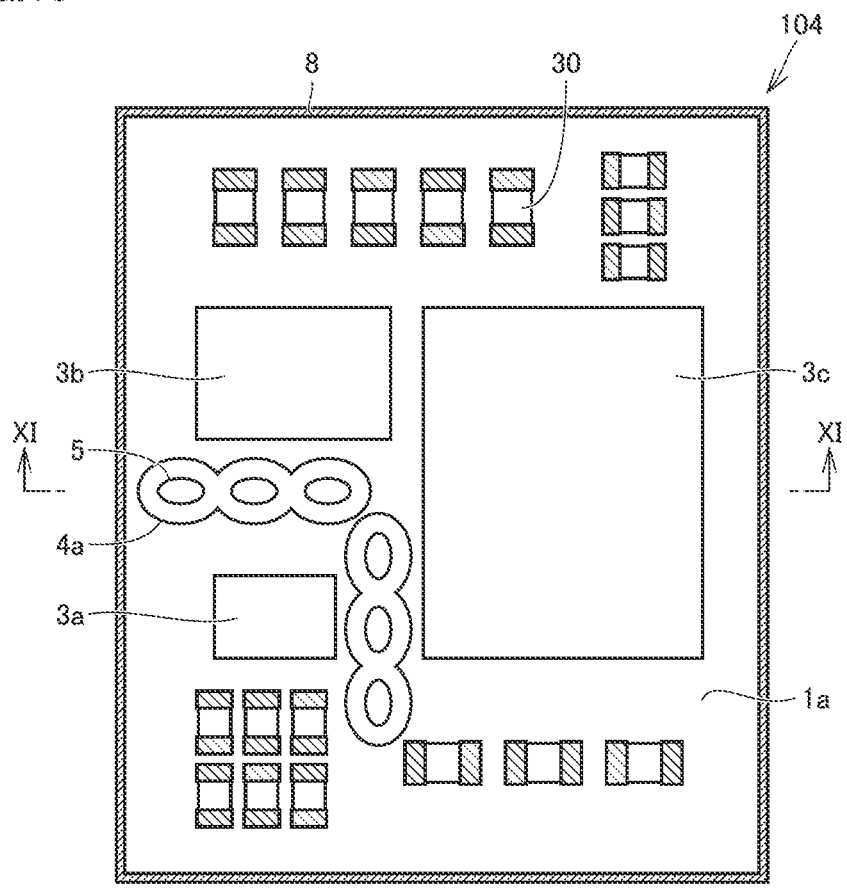
FIG. 10 is a perspective plan view of a first modification of the module according to the third embodiment of the present disclosure.

In the example shown in this case, a series of openings 4a in a vertical row and a series of openings 4a in a horizontal row are separately provided as shown in FIG. 10, but may be connected to each other to form one opening arranged in an L shape.

(Second Modification)

Figure 13:
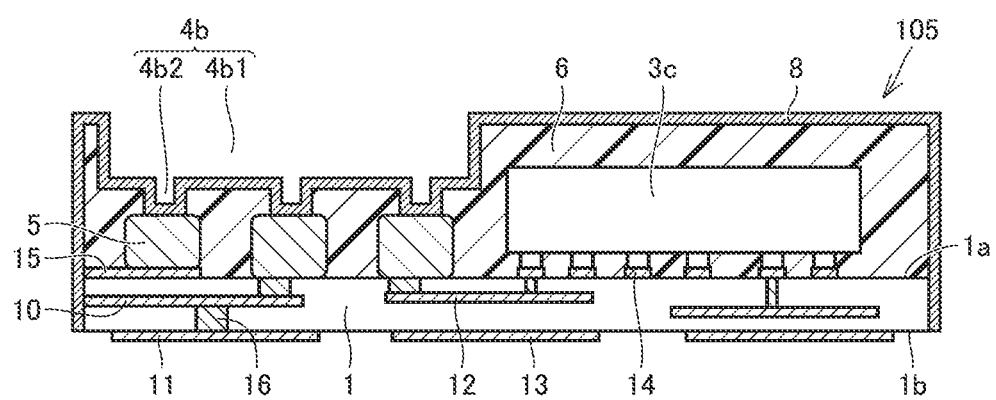
FIG. 13 is a cross-sectional view of a second modification of the module according to the third embodiment of the present disclosure.
Figure 14:
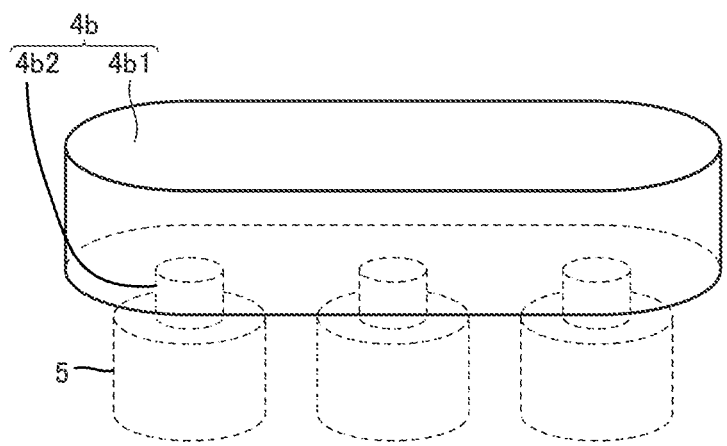
FIG. 14 is a perspective view of an opening and a plurality of conductive members provided in the second modification of the module according to the third embodiment of the present disclosure.

The second modification of the module in the present embodiment will be hereinafter described. In FIGS. 9 and 11, the openings are formed by a combination of taper-shaped recess portions, but the openings may be formed of columnar recess portions as in a module 105 shown in FIG. 13. In module 105, an opening 4b is formed so as to span across the plurality of conductive members 5. Opening 4b includes a portion 4b2 and a portion 4b1. FIG. 14 is a perspective view showing the shapes of opening 4b and the plurality of conductive members 5. Portion 4b1 has an oval shape when viewed from directly above. Portion 4b2 has a columnar shape circular in cross section. A plurality of portions 4b2 are connected to one portion 4b1. Portions 4b2 connect the upper surfaces of the respective conductive members 5 to portion 4b1. A part of the upper surface of each conductive member 5 is exposed at the bottom of a corresponding one of portions 4b2.

(Third Modification)

Figure 15:
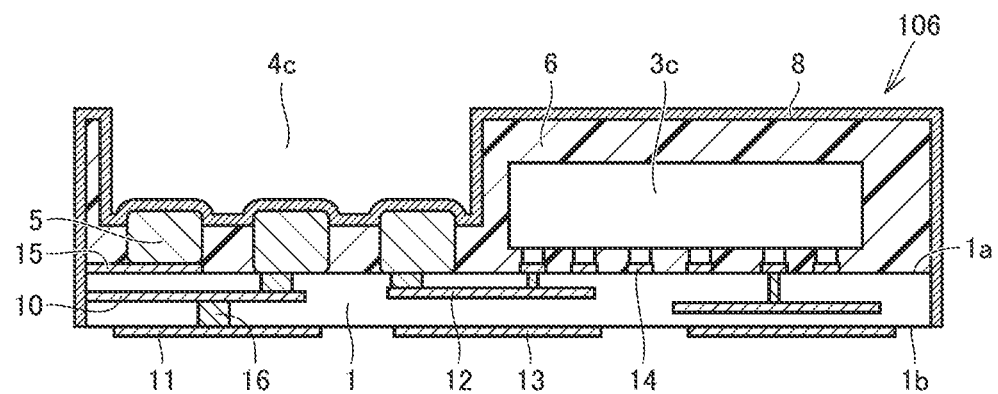
FIG. 15 is a cross-sectional view of a third modification of the module according to the third embodiment of the present disclosure.
Figure 16:
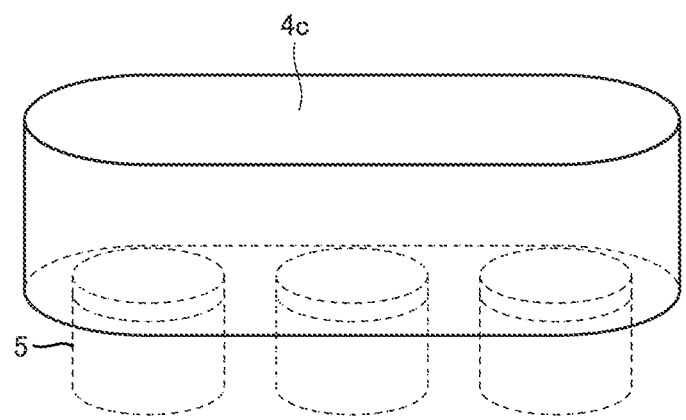
FIG. 16 is a perspective view of an opening and a plurality of conductive members provided in the third modification of the module according to the third embodiment of the present disclosure.

The third modification of the module in the present embodiment will be hereinafter described. A module 106 shown in FIG. 15 has an opening 4c. FIG. 16 is a perspective view showing the shapes of opening 4c and the plurality of conductive members 5. Opening 4c has an oval shape when viewed from directly above. An upper portion of each conductive member 5 protrudes at the bottom of opening 4c. In this way, the upper portions of the plurality of conductive members 5 may protrude inside one opening 4c.

Fourth Embodiment

Figure 17:
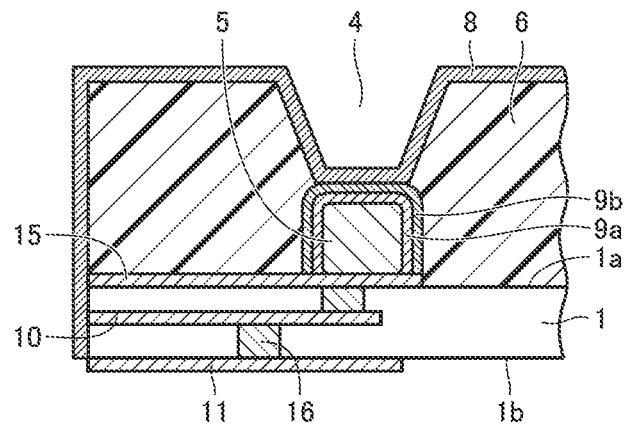
FIG. 17 is a partial cross-sectional view of a module according to a fourth embodiment of the present disclosure.

A module according to the fourth embodiment of the present disclosure will be hereinafter described with reference to FIG. 17.

In the module according to the present embodiment, the surface of conductive member 5 is covered with an Ni plated film 9a, and at least a part of Ni plated film 9a is covered with an Au plated film 9b. In the example shown in FIG. 17, Ni plated film 9a is entirely covered with Au plated film 9b. In other words, the surface of conductive member 5 undergoes what is called Ni/Au plating. Other configurations are the same as those described in the above embodiments.

When opening 4 is formed in sealing resin 6, the upper surface of sealing resin 6 is irradiated with laser light for performing laser processing. In laser processing, sealing resin 6 needs to be dug down until a prescribed region of the upper surface of conductive member 5 is exposed. In this case, in order to ensure electrical connection between conductive member 5 and shield film 8 that is formed in a later step, sealing resin 6 should not remain in a region of the upper surface of conductive member 5 that is exposed at the bottom surface of opening 4. This requires laser light irradiation with sufficient intensity for a sufficient time period. Such laser light irradiation may be performed to such an extent that opening 4 is formed and a part of conductive member 5 is removed. When the material of conductive member 5 is shaved by laser light, the shaved material scatters into the air as smears. When such smears cause problems, the smears can be collected by a suction device, but some or a large amount of smears still adhere to the inner surface of opening 4 or the upper surface of sealing resin 6.

Cu, Ag, etc., which is conceivable as a material of conductive member 5, may scatter as smears when such Cu, Ag, etc., are shaved by laser light. Shield film 8 is formed by a method such as sputtering after opening 4 is formed. When such smears adhere to the inner surface of opening 4 or the upper surface of sealing resin 6, the smears inhibit close adhesion between sealing resin 6 and the sputtering film. This results in poor adhesive strength of the sputtering film that is to serve as shield film 8, and thus, shield film 8 may peel off. In order to prevent such a situation, a cleaning step for removing smears needs to be performed before the step of forming shield film 8. Performing such a cleaning step increases the cost.

In particular, when conductive member 5 is formed of Cu, such Cu on the surface of conductive member 5 is oxidized by heat generated in a reflow heating step for mounting components, and thereby, the laser absorptivity increases.

The following describes the absorptivity of laser light having a wavelength of 1 μm. The absorptivity is 6% on the surface in which Cu is not oxidized, whereas the absorptivity is as high as 85% on the surface in which Cu is oxidized. The absorptivity is 35% on the surface in which Ni is not oxidized, and the absorptivity is 5% on the surface of Au.

When conductive member 5 is formed of Cu and such Cu is exposed as it is as the surface of conductive member 5, Cu is oxidized in this surface of conductive member 5. Thus, this surface of conductive member 5 significantly absorbs laser light and therefore is more likely to be shaved, with the result that production of smears increases. However, when the surface of conductive member 5 is covered with Ni plated film 9a and at least a part of Ni plated film 9a is covered with Au plated film 9b, laser light can be applied only to the surface of Au plated film 9b. Thus, the absorptivity of the laser light decreases, so that the amount of shaving by laser light can be reduced. Thereby, production of smears can be suppressed.

Thus, according to the present embodiment, production of smears can be reduced, and shield film 8 can be less likely to peel off.

When Ni/Au plating is relatively thin and Au plated film 9b has a thickness of about 0.05 μm, for example, Au plated film 9b may be completely removed on the bottom surface of opening 4. Even in such a case, it is considered that Au plated film 9b remains on the side surface of conductive member 5.

Fifth Embodiment

Figure 18:
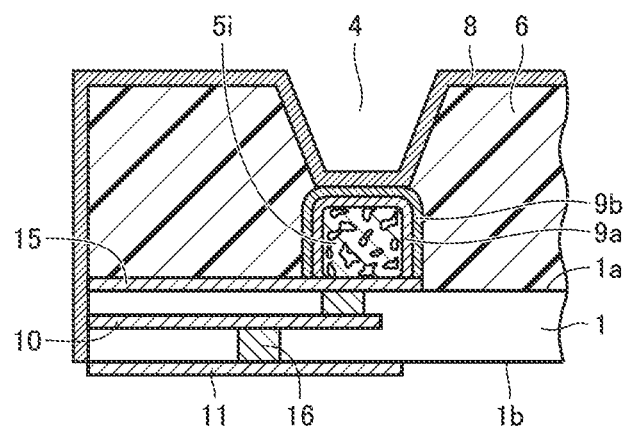
FIG. 18 is a partial cross-sectional view of a module according to a fifth embodiment of the present disclosure.

A module according to the fifth embodiment of the present disclosure will be hereinafter described with reference to FIG. 18.

In the module in the present embodiment, a conductive member 5i is disposed. Conductive member 5i is porous. In other words, conductive member 5i has cavities therein. Conductive member 5i is made of Cu. Porous conductive member 5i can be formed by a known technique. For example, a Cu paste obtained by mixing Cu powder and a solvent is used to form a source member of conductive member 5i, and then, the formed member is fired. During firing, the solvent volatilizes to form porous conductive member 5i. In the present example shown in this case, the surface of conductive member 5i is plated with Ni/Au, but such Ni/Au plating is not indispensable. Other types of plating may be performed, or a plated film may not be formed.

In the present embodiment, since conductive member 5i is porous, the thermal conductivity in conductive member 5i is suppressed. Accordingly, heat diffusion in conductive member 5i that occurs upon laser light irradiation can be prevented. Therefore, redundant sealing resin material can be readily removed by irradiating conductive member 5i with laser light. Thereby, the time period of laser light irradiation can be shortened. This reduces production of smears. Since the time period of laser light irradiation can be shortened, the cost is also suppressed.

Sixth Embodiment

Figure 19:
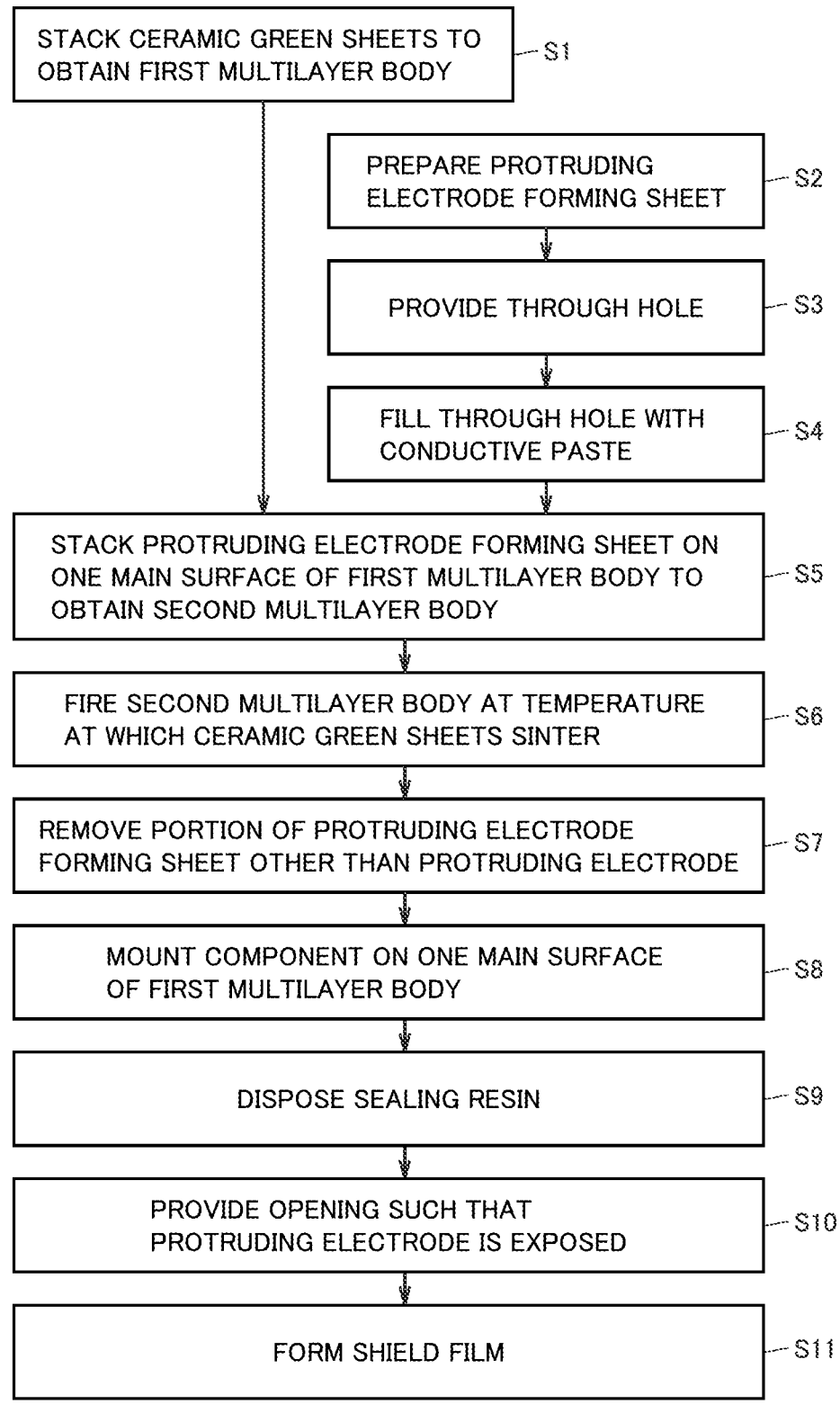
FIG. 19 is a flowchart of a method of manufacturing a module according to a sixth embodiment of the present disclosure.

A method of manufacturing a module according to the sixth embodiment of the present disclosure will be hereinafter described with reference to FIGS. 19 to 29. The method of manufacturing a module in the present embodiment is to obtain module 101 described in the first embodiment. FIG. 19 is a flowchart of a method of manufacturing a module according to the present embodiment.

The method of manufacturing a module according to the present embodiment includes: a step S1 of stacking a plurality of ceramic green sheets to obtain a first multilayer body; a step S2 of preparing a conductive member forming sheet made of a material that does not substantially sinter at a temperature at which the ceramic green sheets sinter; a step S3 of providing a through hole in the conductive member forming sheet; a step S4 of filling the through hole with a conductive paste that is capable of sintering at the temperature at which the ceramic green sheets sinter; a step S5 of stacking the conductive member forming sheet on one main surface of the first multilayer body to obtain a second multilayer body, the conductive member forming sheet having the through hole filled with the conductive paste; a step S6 of firing the second multilayer body at the temperature at which the ceramic green sheets sinter; a step S7 of, after the firing the second multilayer body, removing a portion of the conductive member forming sheet, the portion excluding a conductive member formed as a member obtained by sintering of the conductive paste; a step S8 of mounting a component on the one main surface of the first multilayer body; a step S9 of disposing a sealing resin to cover the component and the conductive member; a step S10 of providing an opening in the sealing resin such that the conductive member is exposed; and a step S11 of, after the providing an opening, forming a shield film to be electrically connected to the conductive member in a state where the shield film covers an outer surface of the sealing resin and an inner surface of the opening.

The following describes each of the steps in greater detail.

Figure 20:
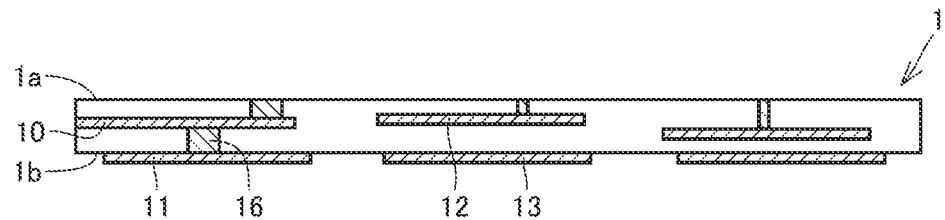
FIG. 20 is an explanatory diagram of a first step of the method of manufacturing a module according to the sixth embodiment of the present disclosure.

First, in step S1, a plurality of ceramic green sheets are stacked to obtain a first multilayer body. FIG. 20 shows wiring board 1 before firing. Wiring board 1 before firing corresponds to the first multilayer body.

Figure 21:
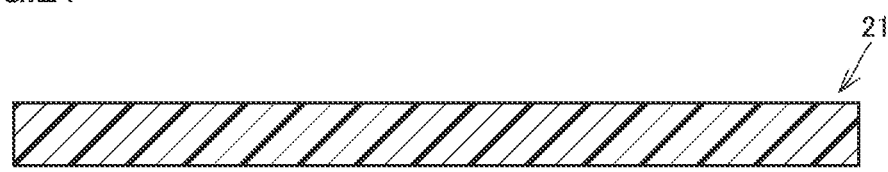
FIG. 21 is an explanatory diagram of a second step of the method of manufacturing a module according to the sixth embodiment of the present disclosure.

In step S2, a conductive member forming sheet 21 is prepared as shown in FIG. 21. It is preferable that conductive member forming sheet 21 is formed of a sheet that does not substantially sinter at the temperature at which the ceramic green sheets sinter. Conductive member forming sheet 21 may contain, for example, alumina powder as an inorganic material that does not substantially sinter at the temperature at which the ceramic green sheets sinter. Conductive member forming sheet 21 may be obtained by forming slurry containing alumina powder, an organic binder, and a solvent into a sheet shape by a doctor blade method or the like. The slurry may contain various types of additives such as a dispersant and a plasticizer. Conductive member forming sheet 21 may be formed of some type of resin. Conductive member forming sheet 21 may be formed of a resin that burns out at a temperature equal to or lower than the temperature at which the ceramic green sheets sinter. Examples of the material of conductive member forming sheet 21 may be an acrylic resin, a polypropylene resin, and the like.

Figure 22:
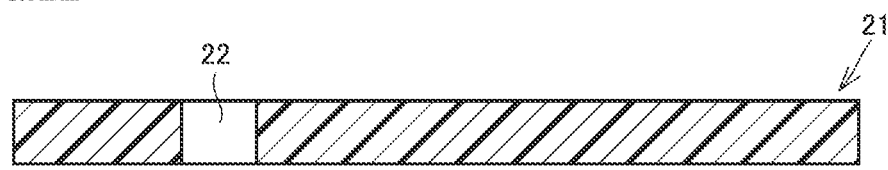
FIG. 22 is an explanatory diagram of a third step of the method of manufacturing a module according to the sixth embodiment of the present disclosure.

In step S3, as shown in FIG. 22, a through hole 22 is formed in conductive member forming sheet 21. Through hole 22 can be formed by a method such as laser processing or punching.

Figure 23:
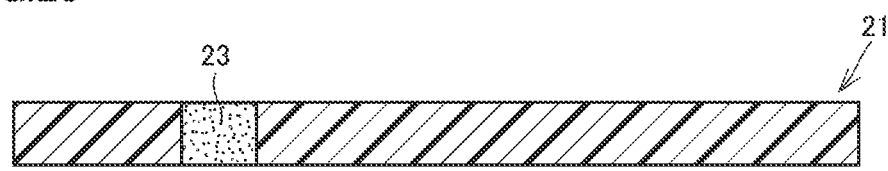
FIG. 23 is an explanatory diagram of a fourth step of the method of manufacturing a module according to the sixth embodiment of the present disclosure.

In step S4, as shown in FIG. 23, through hole 22 is filled with a conductive paste 23 that can sinter at the temperature at which the ceramic green sheets sinter.

Figure 24:
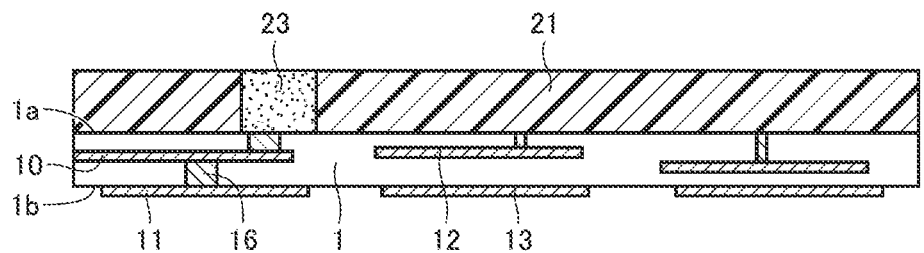
FIG. 24 is an explanatory diagram of a fifth step of the method of manufacturing a module according to the sixth embodiment of the present disclosure.

In step S5, as shown in FIG. 24, conductive member forming sheet 21 having through hole 22 filled with conductive paste 23 is stacked on one main surface of wiring board 1 as the first multilayer body to thereby obtain a second multilayer body. The entire structure shown in FIG. 24 corresponds to the second multilayer body.

Figure 25:
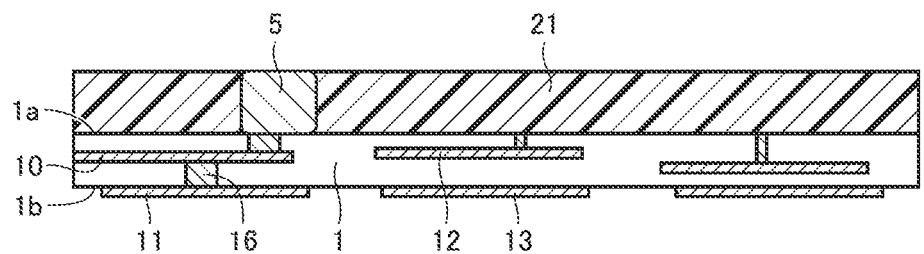
FIG. 25 is an explanatory diagram of a sixth step of the method of manufacturing a module according to the sixth embodiment of the present disclosure.

In step S6, as shown in FIG. 25, the second multilayer body is fired at the temperature at which the ceramic green sheets sinter. Thereby, wiring board 1 sinters and is integrated. Also, conductive paste 23 solidifies in the firing step.

Figure 26:
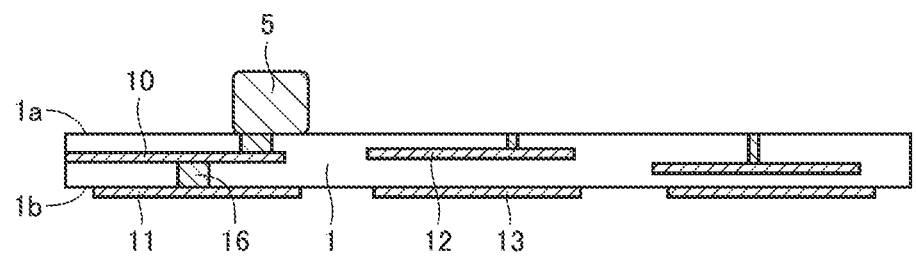
FIG. 26 is an explanatory diagram of a seventh step of the method of manufacturing a module according to the sixth embodiment of the present disclosure.

In step S7, after the second multilayer body is fired, as shown in FIG. 26, a portion of conductive member forming sheet 21 other than a conductive member 5 formed as a member obtained by sintering of conductive paste 23 is removed. In this removing step, a method such as wet blasting, sand blasting, or brushing can be used.

In the case where conductive member forming sheet 21 is formed of a resin that burns out at a temperature equal to or lower than the temperature at which the ceramic green sheets sinter, a portion of conductive member forming sheet 21 other than conductive member 5 burns out at the time when step S6 is performed, and therefore, step S7 does not need to be performed.

Figure 27:
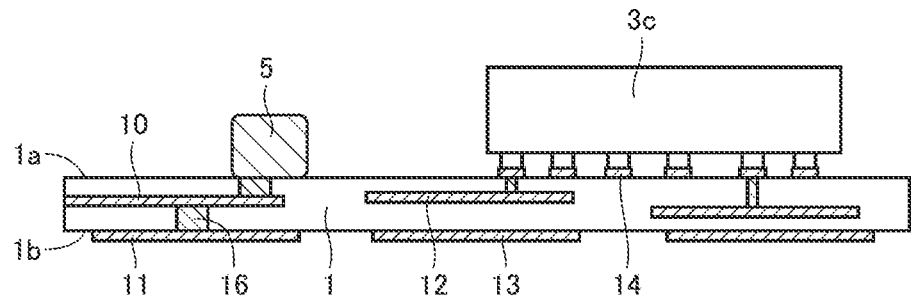
FIG. 27 is an explanatory diagram of an eighth step of the method of manufacturing a module according to the sixth embodiment of the present disclosure.

In step S8, as shown in FIG. 27, a component is mounted on one main surface of the first multilayer body. In this case, surface electrode 14 is used in mounting third component 3c. Surface electrode 14, which first appears in FIG. 27, is not shown in FIGS. 20 and 24 to 26 but actually present in the cases of these figures.

Figure 28:
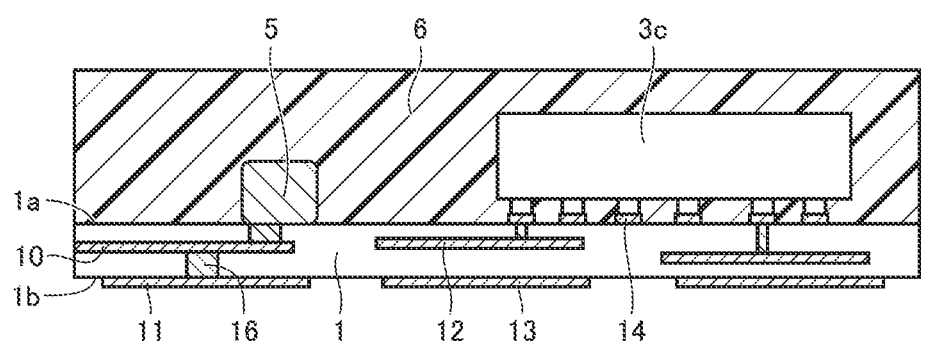
FIG. 28 is an explanatory diagram of a ninth step of the method of manufacturing a module according to the sixth embodiment of the present disclosure.

In step S9, as shown in FIG. 28, sealing resin 6 is provided so as to cover the component and conductive member 5.

Figure 29:
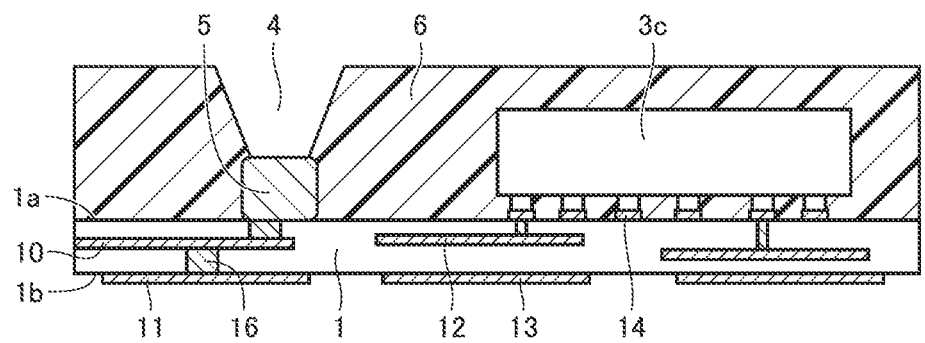
FIG. 29 is an explanatory diagram of a tenth step of the method of manufacturing a module according to the sixth embodiment of the present disclosure.

In step S10, as shown in FIG. 29, opening 4 is provided in sealing resin 6 such that conductive member 5 is exposed. This step can be performed by irradiating the upper surface of sealing resin 6 with laser light.

In step S11, after the step of providing opening 4, shield film 8 is formed so as to be electrically connected to conductive member 5 in the state where shield film 8 covers the outer surface of sealing resin 6 and the inner surface of opening 4. Thus, module 101 shown in FIG. 3 can be obtained.

In the present embodiment, since the manufacturing method includes steps S1 to S11, shielding between the components can be achieved by conductive member 5 and shield film 8, and also, a module having a structure with no soldered portion provided around conductive member 5 can be obtained. In other words, it is possible to manufacture a module that does not cause problems such as jetting-out of solder and generation of undesirable solder balls even when the entire module undergoes reflowing.

Among the above-described embodiments, some of the embodiments may be employed in an appropriate combination.

The above embodiments disclosed herein are illustrative and non-restrictive in every respect. The scope of the present disclosure is defined by the terms of the claims, and is intended to include any modifications within the meaning and scope equivalent to the terms of the claims.

1 wiring board, 1a first main surface, 1b second main surface, 3a first component, 3b second component, 3c third component, 4, 4a, 4b, 4c opening, 4b1, 4b2 portion, 5, 5a, 5b conductive member, 6 sealing resin, 8 shield film, 9a Ni plated film, 9b Au plated film, 10 ground conductor, 11 backside electrode (of GND), 12 internal electrode, 13 backside electrode, 14 surface electrode, 15 surface electrode (connected to shield film), 16 interlayer connection conductor, 21 conductive member forming sheet, 22 through hole, 23 conductive paste, 30 component, 101, 102, 103, 104, 105, 106 module.

The invention claimed is:

1. A module comprising:
   a wiring board having a first main surface, the wiring board being a ceramic board including a ground conductor;
   a first component and a second component, the first component and the second component being mounted on the first main surface;
   at least one conductive member disposed on the first main surface in direct contact therewith, wherein the conductive member is disposed between the first component and the second component;
   a sealing resin sealing the first component, the second component, and the conductive member; and
   a shield film covering an upper surface and a side surface of the sealing resin and a side surface of the wiring board, wherein
   the shield film is electrically connected to the ground conductor,
   the conductive member is a sintered body formed by sintering a conductive paste, and
   the conductive member is a simultaneously fired member with the wiring board, and is electrically connected to the ground conductor and electrically connected to the shield film.

2. The module according to claim 1, wherein
   the sealing resin has an opening above the conductive member, and
   the shield film is electrically connected to an upper surface of the conductive member in a state where the shield film extends to cover an inner surface of the opening.

3. The module according to claim 1, wherein
   the wiring board includes a connection electrode connected to the conductive member, and
   the connection electrode and the conductive member are comprised of a same material.

4. The module according to claim 1, wherein the conductive member is comprised of Cu or Ag.

5. The module according to claim 1, wherein
   at least one of the first component and the second component has a circuit surface, and an upper end of the conductive member is located higher than a highest one of the circuit surfaces of the first component and the second component as viewed from the first main surface.

6. The module according to claim 1, wherein a surface of the conductive member is covered with an Ni plated film, and at least a part of the Ni plated film is covered with an Au plated film.

7. The module according to claim 1, wherein the conductive member is porous.

8. The module according to claim 1, wherein the first component is to serve as a source from which an electromagnetic wave is emitted, and the second component is to avoid being interfered by an electromagnetic wave from outside.

9. The module according to claim 1, wherein the conductive member is electrically connected to the shield film along the side surface of the sealing resin.

10. A method of manufacturing a module, the method comprising:
    stacking a plurality of ceramic green sheets to obtain a first multilayer body;
    preparing a conductive member forming sheet made of a material not substantially sintering at a temperature at which the ceramic green sheets sinter;
    providing a through hole in the conductive member forming sheet;
    filling the through hole with a conductive paste capable of sintering at the temperature at which the ceramic green sheets sinter;
    stacking the conductive member forming sheet on one main surface of the first multilayer body to obtain a second multilayer body, the conductive member forming sheet having the through hole filled with the conductive paste;
    firing the second multilayer body at the temperature at which the ceramic green sheets sinter and the conductive paste is capable of sintering, wherein a conductive member is formed as a member obtained by sintering of the conductive paste;
    after the firing the second multilayer body, removing a portion of the conductive member forming sheet, the portion excluding the conductive member;
    mounting a component on the one main surface of the first multilayer body;
    disposing a sealing resin to cover the component and the conductive member;
    providing an opening in the sealing resin such that the conductive member is exposed; and
    after the providing an opening, forming a shield film to electrically connect to the conductive member in a state where the shield film covers an outer surface of the sealing resin and an inner surface of the opening.

11. The module according to claim 2, wherein
    the wiring board includes a connection electrode connected to the conductive member, and
    the connection electrode and the conductive member are comprised of a same material.

12. The module according to claim 2, wherein the conductive member is comprised of Cu or Ag.

13. The module according to claim 3, wherein the conductive member is comprised of Cu or Ag.

14. The module according to claim 2, wherein
    at least one of the first component and the second component has a circuit surface, and an upper end of the conductive member is located higher than a highest one of the circuit surfaces of the first component and the second component as viewed from the first main surface.

15. The module according to claim 3, wherein
    at least one of the first component and the second component has a circuit surface, and an upper end of the conductive member is located higher than a highest one of the circuit surfaces of the first component and the second component as viewed from the first main surface.

16. The module according to claim 4, wherein
    at least one of the first component and the second component has a circuit surface, and an upper end of the conductive member is located higher than a highest one of the circuit surfaces of the first component and the second component as viewed from the first main surface.

17. The module according to claim 2, wherein a surface of the conductive member is covered with an Ni plated film, and at least a part of the Ni plated film is covered with an Au plated film.

18. The module according to claim 3, wherein a surface of the conductive member is covered with an Ni plated film, and at least a part of the Ni plated film is covered with an Au plated film.

19. The module according to claim 4, wherein a surface of the conductive member is covered with an Ni plated film, and at least a part of the Ni plated film is covered with an Au plated film.

20. The module according to claim 5, wherein a surface of the conductive member is covered with an Ni plated film, and at least a part of the Ni plated film is covered with an Au plated film.

21. The module according to claim 1, wherein no solder is interposed between the conductive member and wiring board.

22. The module according to claim 1, wherein a plated film is interposed between the conductive member and the shield film.

* * * * *